United States Patent
Shim et al.

(10) Patent No.: US 7,457,058 B2
(45) Date of Patent: Nov. 25, 2008

(54) OPTICAL ELEMENT HOLDER AND PROJECTION EXPOSURE APPARATUS HAVING THE SAME

(75) Inventors: Woo-Seok Shim, Seoul (KR);
Jung-Hyeon Lee, Yongin-si (KR);
Young-Koog Han, Seoul (KR);
Kwang-Sub Yoon, Seoul (KR);
Si-Hyeung Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 149 days.

(21) Appl. No.: 11/451,580

(22) Filed: Jun. 13, 2006

(65) Prior Publication Data

US 2006/0291077 A1    Dec. 28, 2006

(30) Foreign Application Priority Data

Jun. 22, 2005    (KR) ..................... 10-2005-0053767

(51) Int. Cl.
*G02B 26/02* (2006.01)
(52) U.S. Cl. ................. 359/821; 359/236; 359/508; 355/71; 362/277
(58) Field of Classification Search ................. 359/236, 359/508, 821; 355/71; 362/277
See application file for complete search history.

(56) References Cited

U.S. PATENT DOCUMENTS

| 6,388,736 | B1 | 5/2002 | Smith et al. |
| 2004/0239904 | A1 | 12/2004 | Nishinaga |
| 2004/0263977 | A1* | 12/2004 | Toyoda et al. ............... 359/558 |

FOREIGN PATENT DOCUMENTS

| JP | 2003-178951 | 6/2003 |
| KR | 10-2005-0002310 | 1/2005 |
| KR | 10-2005-0012031 | 1/2005 |

* cited by examiner

*Primary Examiner*—Joseph Martinez
(74) *Attorney, Agent, or Firm*—Harness, Dickey & Pierce, P.L.C.

(57) ABSTRACT

In an optical member holder and a projection exposure apparatus having the same, a light beam radiated from a light source may be formed into light having a desired shape by selecting one of a plurality of optical elements. An optical element holder may include a support member to support the plurality of optical elements, a first driving section to move or rotate the support member to select one of the optical elements, and a second driving section to rotate the selected optical element to adjust an arrangement direction thereof. The light formed by the selected optical element may be directed through a reticle.

17 Claims, 5 Drawing Sheets

OPTICAL ELEMENT HOLDER AND PROJECTION EXPOSURE APPARATUS HAVING THE SAME

CLAIM OF PRIORITY

A claim of priority is made under 35 USC § 119 of Korean Patent Application No. 2005-53767 filed on Jun. 22, 2005, the disclosure of which is hereby incorporated herein by reference in its entirety.

BACKGROUND OF THE INVENTION

1. Field of the Invention

Example embodiments of the present invention relate to an optical element holder and a projection exposure apparatus having the same. More particularly, example embodiments of the present invention relate to an optical element holder for receiving a plurality of optical elements to form light having different shapes, and a projection exposure apparatus for transcribing a reticle image pattern onto a substrate using the optical element holder.

2. Description of the Related Art

In general, a semiconductor device may be manufactured by performing a fabrication process to form electrical circuits on a semiconductor substrate, an electrical die sorting process to inspect electrical characteristics of the electric circuits formed on the semiconductor substrate, a packaging process to package semiconductor devices formed on the semiconductor substrate with epoxy resins, and sorting the individual semiconductor devices.

A fabrication process may include repeating various unit processes performed in order to form electrical circuits on a semiconductor substrate. The unit processes may include a deposition process, a photolithography process, an etching process, a chemical mechanical polishing (CMP) process, an ion implantation process, a cleaning process, and the likes.

A photolithography process may be performed to form a photoresist pattern on a layer formed by a deposition process. The photoresist pattern may be used as an etching mask in an etching process performed to form a layer into desired patterns.

Further, the photolithography process may include a photoresist coating process to form a photoresist film on a semiconductor substrate, a baking process to harden the photoresist film, and exposure and developing processes to form the photoresist film into a photoresist pattern corresponding to a reticle image pattern.

As a packing density of a semiconductor device has become highly integrated, a size of patterns to be formed on a semiconductor substrate has been reduced, and thus, resolution and depth of focus (DOF) have become more important in a photolithography process.

The resolution and the DOF may be influenced by a wavelength of light beam and a numerical aperture (NA) of a projection lens. Examples of the light beam used in a photolithography process may include a G-line light beam having a wavelength of 436 nm, an I-line light beam having a wavelength of 365 nm, a KrF laser beam having a wavelength of 248 nm, an ArF laser beam having a wavelength of 193 nm, a F2 laser beam having a wavelength of 157 nm, and the likes.

Methods of preventing distortion of a photoresist pattern, for example, due to scattering and diffraction of light beam transmitted through a reticle image pattern, include using a phase shift mask (PSM) or an optical proximity correction (OPC) method.

Increasing a numerical aperture of a projection lens to improve resolution may cause DOF to deteriorate. An off-axis illumination (OAI) may be used to improve the DOF by projecting zero-order and positive first-order diffracted light beams from an image pattern onto a semiconductor substrate.

Examples of the OAI may include an annular illumination, a dipole illumination, quadrupole illumination, a cross-pole illumination, a hexapole illumination, and the like.

An exposure apparatus may include an aperture diaphragm plate to form illumination light having different shapes from each other. The aperture diaphragm plate may serve as an optical element holder to support a plurality of aperture diaphragms having different shapes from each other in order to selectively form illumination light having different shapes from each other. The aperture diaphragms may be arranged in a circumferential direction of the aperture diaphragm plate that may be rotatably disposed to select one of the aperture diaphragms. For example, the aperture diaphragm plate may have circular diaphragms to form circular illumination light having different diameters from each other, a quadrupole diaphragm for forming a quadrupole illumination light, and an annular diaphragm for forming an annular illumination light.

As shapes of a pattern have become more dynamic and a width of a pattern has become finer, there has been a need for various types of illumination light. However, increasing the number of aperture diaphragms may be limited because of design space limitations of an exposure apparatus. Therefore, it may be inconvenient to frequently change the aperture diaphragm plate, thereby deteriorating throughput of an exposure process.

SUMMARY OF THE INVENTION

Example embodiments of the present invention may provide an optical element holder capable of improving utilization efficiency of optical elements.

Example embodiments of the present invention may also provide a projection exposure apparatus having an optical element holder capable of improving utilization efficiency of optical elements.

In an example element of the present invention, an optical element holder may include a support member configured to support a plurality of optical elements used to form light having different shapes, the plurality of optical elements being arranged circumferentially with respect to a central axis of the support member, and a rotational driving section configured to rotate the support member and the plurality of optical elements, the plurality of optical elements configured to rotate about the central axis of the support member, and each of the plurality of optical elements configured to rotate about its central axis.

In another example embodiment of the present invention, an optical element holder may include a support member configured to support a plurality of optical elements used to form light having different shapes, a first driving section configured to move the support member to select one of the plurality of optical elements, and a second driving section configured to rotate the selected optical element to adjust an arrangement direction of the selected optical element.

In an example embodiment of the present invention, a projection exposure apparatus may include a light source configured to generate a light beam, a plurality of optical elements configured to form the light beam into light having different shapes, an optical element holder including a support member configured to support the optical elements, and a rotational driving section configured to rotate the support member and the plurality of optical elements, the plurality of optical elements being configured circumferentially with respect to a central axis of the support member, and the rotational driving section configured to rotate the support member to select one of the optical elements and rotate the selected optical element to adjust an arrangement direction the selected optical element, a reticle stage configured to support a reticle, and a projection optical system configured to direct the light transmitted through the reticle to transcribe an image pattern onto a substrate.

In another example embodiment of the present invention, a projection exposure apparatus may include a light source configured to generate a light beam, a plurality of optical elements configured to form the light beam into light having different shapes, an optical element holder including a support member configured to support the plurality of optical elements, a first driving section configured to move the support member to select one of the optical elements, and a second driving section configured to rotate the selected optical element to adjust an arrangement direction of the selected optical element, a reticle stage configured to support a reticle, and a projection optical system configured to direct light transmitted through the reticle to transcribe an image pattern onto a substrate.

BRIEF DESCRIPTION OF THE DRAWINGS

Example embodiments of the present invention will become readily apparent along with the following detailed description when considered in conjunction with the accompanying drawings wherein.

DESCRIPTION OF THE EXAMPLE EMBODIMENTS OF THE INVENTION

Figure 1:
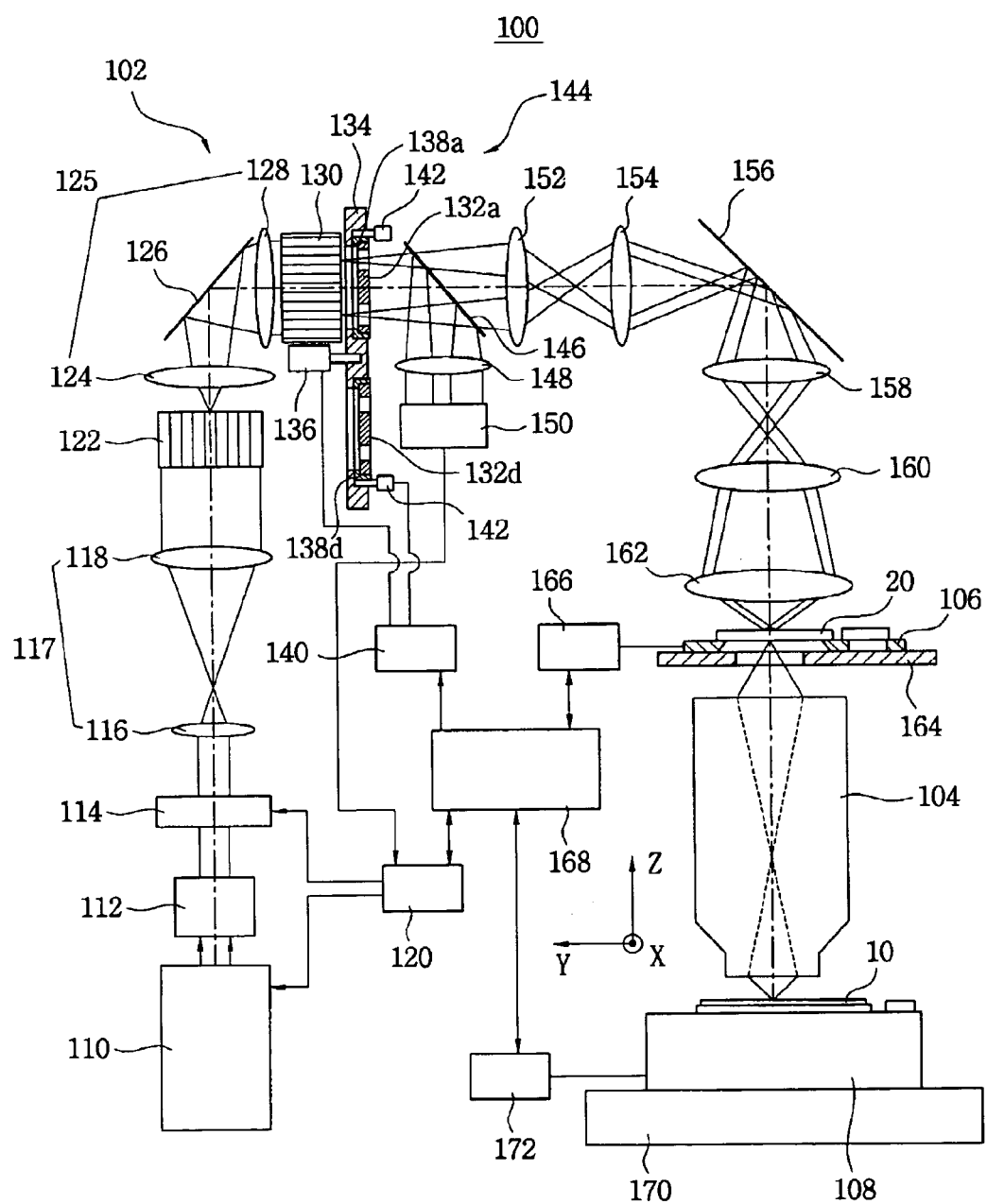
FIG. 1 is a schematic view illustrating a carrousel optical element holder and a projection exposure apparatus having the same in accordance with an example embodiment of the present invention.

Example embodiments of the present invention now will be described more fully hereinafter with reference to the accompanying drawings, in which example embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the example embodiments of the present invention will be explained in detail with reference to the accompanying drawings.

FIG. 1 is a schematic view illustrating a carrousel optical element holder and a projection exposure apparatus having the same in accordance with an example embodiment of the present invention.

Referring to FIG. 1, a projection exposure apparatus 100 may include an illumination optical system 102, and a projection optical system 104. A reticle stage 106 may be disposed between the illumination optical system 102 and the projection optical system 104 to support a reticle 20 having an image pattern to be transcribed onto a semiconductor substrate 10, for example, a silicon wafer. A substrate stage 108 may be disposed under the projection optical system 104 to support the semiconductor substrate 10.

The illumination optical system 102 may be used for directing light having a shape selected in accordance with an image pattern onto the reticle 20, and may include a plurality of optical elements.

Light beam generated by a light source 110 may be formed into the light having the selected shape by one selected from the optical elements, and then the light may be formed into a projection light having image data on the image pattern by being transmitted through the reticle 20. The projection light transmitted through the reticle 20 may be directed onto the semiconductor substrate 10 by the projection optical system 104, and thus the image pattern of the reticle 20 may be transcribed onto a photoresist film formed on the semiconductor substrate 10.

Examples of the light source 110 may include an ArF excimer laser, a KrF excimer laser, a YAG laser, a mercury lamp, and the like. The light beam radiated from the light source 110 may be directed into a beam shaping unit 117 through a beam matching unit 112 for positionally matching an optical path with respect to a main exposure apparatus body and a light attenuator 114. The beam shaping unit 117 may include a first lens system 116 and a second lens system 118 arranged along a desired or predetermined optical axis. An exposure control system 120, which may be provided to control an amount of exposure with respect to the photoresist film on the semiconductor substrate 10, may control the start and stop of the emission of the light source 110 as well as the output, for example, oscillation frequency and pulse energy, and adjust a dimming ratio for the light attenuator 114 continuously or in a stepwise manner.

The light beam that passes through the beam shaping unit 117 may be transmitted to a first fly's eye lens 122 serving as a first stage optical integrator (uniformizer or homogenizer). The light beam, output from the first fly's eye lens 122 through a third lens system 124, may reflect off a first reflecting mirror 126 serving as an optical path-bending member. The light beam reflected by the first reflecting mirror 126 and through a fourth lens system 128 may be transmitted to a second fly's eye lens 130 serving as a second stage optical integrator. A relay optical unit 125 serving as a light-collecting optical unit may be constructed of the third and fourth lens systems 124 and 128.

The light beam passed through the second fly's eye lens 130 may be formed into light having a specific shape by passing through one of a plurality of aperture plates 132a-132f selected on the basis of an image pattern of the reticle 20. The selected aperture plate may serve as a light forming member and may be supported by a support member 134 having a disk shape. The support member 134 may be capable of rotating using a first rotational driving device 136, and may be disposed adjacent to a light-outgoing plane of the second fly's eye lens 130.

The support member 134 may support the plurality of aperture plates 132a-132f using a plurality of receiving members 138a-138f, and may rotate the aperture plates 132a-132f so as to select one of the aperture plates 132a-132f in accordance with the image pattern. The selected aperture may be placed on an optical axis by rotation of the support member 134, and an operation of the first rotational driving device 136 may be controlled by a driving system 140. The selected aperture plate may be disposed to be capable of rotating using a second rotational driving device 142, and the shape of the light may be determined by rotating the selected aperture plate. Further detailed descriptions in connection with the aperture plates 132a-132f and a carrousel optical element holder 144 will be discussed below.

The illumination light passed through the selected aperture plate 132a may be transmitted to a beam splitter 146. The light reflected by the beam splitter 146 may be transmitted to an integrator sensor 150 composed of a photoelectric detector via a light-collecting lens 148, and a detection signal from the integrator sensor 150 may be provided to the exposure control system 120. The exposure control system 120 may be constructed so that illuminance of the light and the integral value thereof may be indirectly monitored in accordance with the detection signal of the integrator sensor 150.

The light transmitted through the beam splitter 146 may be sequentially transmitted through a fifth lens system 152 and a sixth lens system 154, and may be reflected by a second reflecting mirror 156. The light reflected by the second reflecting mirror 156 may be transmitted to an image-forming lens unit 158, and the light transmitted through the image-forming lens unit 158 may be sequentially transmitted to an auxiliary condenser lens unit 160 and a main condenser lens unit 162. The illumination light transmitted through the auxiliary and main condenser lens units 160 and 162 may illuminate the reticle 20.

Though not depicted in FIG. 1, the second fly's eye lens 130, the fifth lens system 152, and the sixth lens system 154 may be moved along the optical axis of the light by driving sections controlled by the driving system 140.

The reticle stage 106 to support the reticle 20 may be movably disposed on a reticle base 164 under the main condenser lens unit 162. The reticle stage 106 may move in a y-axis direction, as shown in FIG. 1, during an exposure process. Further, the reticle stage 106 may be disposed to be capable of moving in an x-axis direction and rotating about the optical axis of the light. Position and rotation angle of the reticle stage 106 may be measured by a laser interferometer of a first driving control system 166. Based on a result of measurements and control information from a main control system 168, a driving motor, for example, a linear motor or a voice coil motor, may control the scanning speed and position of the reticle stage 106.

A projection light transmitted through the reticle 20 may have image data on the reticle 20 image pattern, and the projection light may be directed onto the semiconductor substrate 10 by the projection optical system 104. The substrate stage 108 for supporting the semiconductor substrate 10 may be movably disposed on a substrate base 170, and may move in a direction opposite to the movement direction during the exposure process. Further, the substrate stage 108 may move in x-axis and y-axis directions in a stepping manner in order to repeatedly perform the exposure process on shot areas of the semiconductor substrate 10. A leveling mechanism of the substrate stage 108 may be operated on the basis of a measured value from an auto focus sensor, and thus the best focusing position may be determined.

Position and rotation angle of the substrate stage 108 may be measured by a laser interferometer (not shown) of a second driving control system 172, and a driving motor, for example, a linear motor or a voice coil motor, may control the scanning speed and position of the substrate stage 108 on the basis of the result of measurement and control information from the main control system 168.

Figure 2:
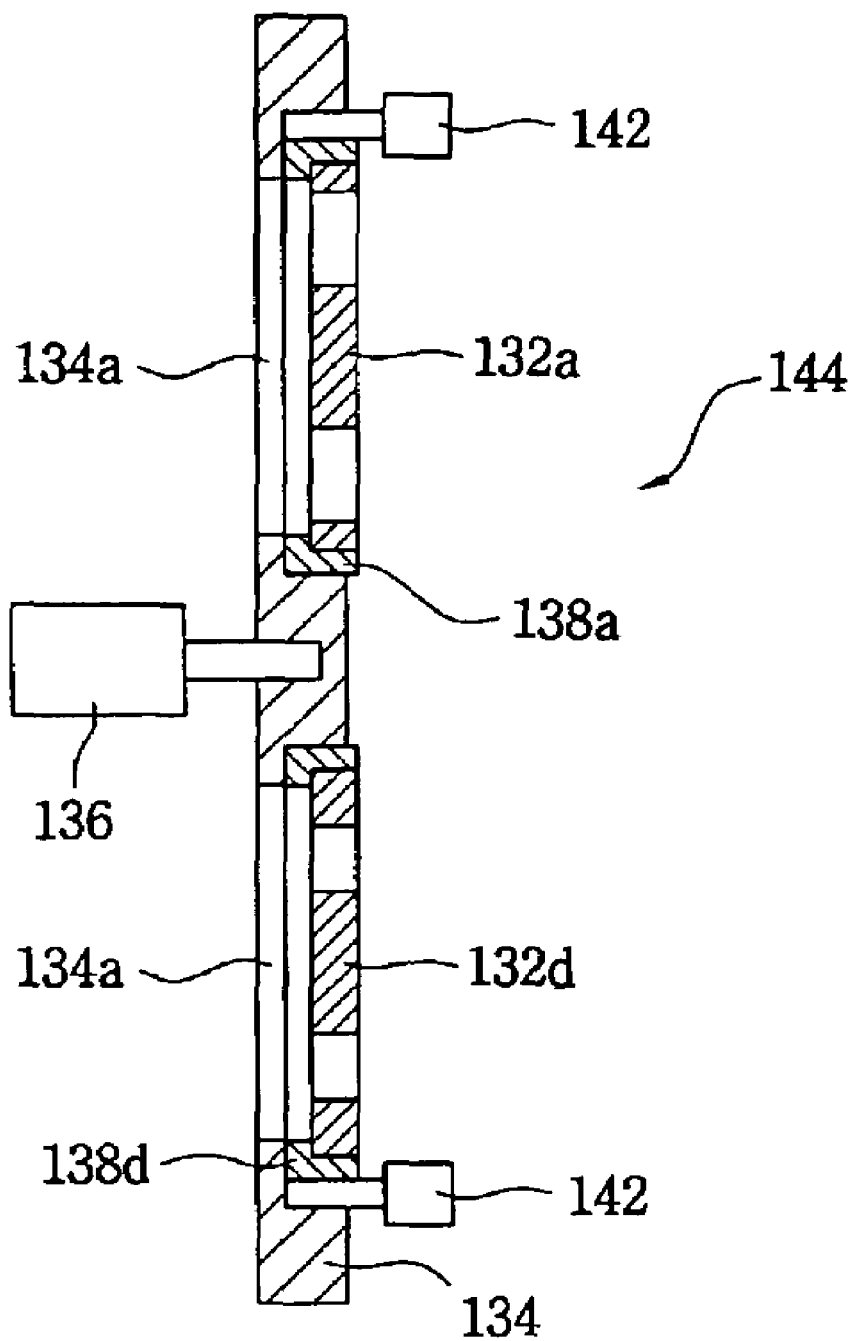
FIG. 2 is an enlarged cross-sectional view illustrating the carrousel optical element holder as shown in FIG. 1.
Figure 3:
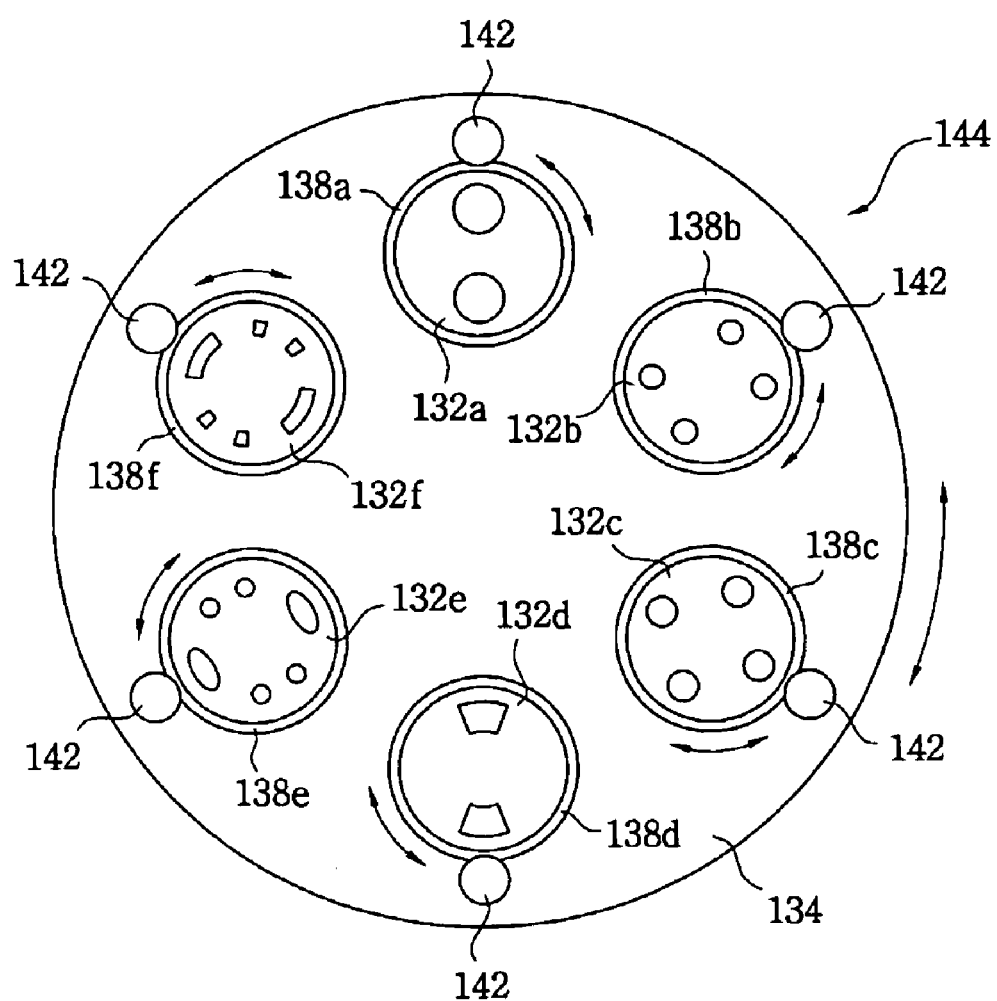
FIG. 3 is a side view illustrating the carrousel optical element holder as shown in FIG 1.

FIG. 2 is an enlarged cross-sectional view illustrating the carrousel optical element holder as shown in FIG. 1, and FIG. 3 is a side view illustrating the carrousel optical element holder as shown in FIG. 1.

Referring to FIGS. 2 and 3, the carrousel optical element holder 144 may support at least two optical elements and adjust the arrangement direction of the optical elements. As shown in the figures, the carrousel optical element holder 144 may include a support member 134 for supporting aperture plates 132a, 132b, 132c, 132d, 132e and 132f, which may serve as light forming members, and a rotational driving device for rotating the aperture plates 132a, 132b, 132c, 132d, 132e and 132f about a central axis of the support member 134 and also for rotating each of the aperture plates 132a, 132b, 132c, 132d, 132e and 132f about its own axis. The rotational driving device may include the first rotational driving device 136 for rotating the support member 134 in order to select one of the aperture plates 132a, 132b, 132c, 132d, 132e and 132f, and may also include the second rotational driving device 142 for rotating one of the selected aperture plates 132a-132f in order to adjust the arrangement direction of one of the selected aperture plates 132a-132f.

The support member 134 may have a disk shape, and the aperture plates 132a, 132b, 132c, 132d, 132e and 132f may be arranged in a circumferential direction around the central axis of the support member 134. Further, the support member 134 may have a plurality of holes 134a in which the aperture plates 132a, 132b, 132c, 132d, 132e and 132f may be inserted therein, and a plurality of receiving members 138a, 138b, 138c, 138d, 138e and 138f may be rotatably inserted in the holes 134a to receive the aperture plates 132a, 132b, 132c, 132d, 132e and 132f, respectively.

The receiving members 138a, 138b, 138c, 138d, 138e and 138f may have an annular ring shape, and external gears (nor shown) may be formed at lateral surfaces of the receiving members 138a, 138b, 138c, 138d, 138e and 138f for engagement with the second rotational driving device 142. The second rotational driving device 142 may include a plurality of motors to separately rotate the receiving members 138a, 138b, 138c, 138d, 138e and 138f, and driving gears (not shown) may be fixed to rotational shafts of the motors for engagement with the receiving members 138a, 138b, 138c, 138d, 138e and 138f.

For example, the receiving members 138a, 138b, 138c, 138d, 138e and 138f may receive dipole aperture plates 132a and 132d for forming dipole light, a quadrupole aperture plate 132b for forming a quadrupole light, a cross-pole aperture plate 132c for forming a cross-pole light, and hexapole aperture plates 132e and 132f for forming hexapole light.

Though not shown in the figures, a circular aperture plate for forming a conventional circular light or an annular aperture plate for forming an annular light may be mounted to the support member 134.

If the circular aperture plate, the annular aperture plate, and the multi-pole aperture plates having a plurality of poles are all mounted to the support member 134, only the multi-pole aperture plates may be connected to the second rotational driving device 142.

Although the figures only show six aperture plates 132a, 132b, 132c, 132d, 132e, and 132f mounted to the support member 134, example embodiments of the present invention are not limited to this configuration. Accordingly, the number of aperture plates may be varied. Also, the aperture plates 132a, 132b, 132c, 132d, 132e and 132f may be separately rotated by a magnet force using a permanent magnet or an electromagnetic force.

The first and second rotational driving devices 136 and 142 may be controlled by the driving system 140. For example, the driving system 140 may control operations of the first rotational driving device 136 in order to select one of the aperture plates 132a, 132b, 132c, 132d, 132e and 132f, and may also control operations of the second rotational driving device 142 in order to adjust the arrangement direction of the selected aperture plate 132a.

For example, when a reticle 20 has an image pattern of a line and space type extending in an x-axis direction, a first rotational driving device 136 may rotate a support member 134 so that a dipole aperture plate 132a or 132d may intersect an optical axis of light. Further, the second rotational driving device 142 may adjust the arrangement direction of the dipole aperture plate 132a or 132d so that poles of the dipole light formed by the dipole aperture plate 132a or 132d may be arranged in a y-axis direction. When the reticle 20 has an image pattern extending in a y-axis direction, the second rotational driving device 142 may adjust the arrangement direction of the dipole aperture plate 132a or 132d so that the poles of the dipole light formed by the dipole aperture plate 132a or 132d may be arranged in an x-axis direction.

As described above, after selecting one of the aperture plates 132a, 132b, 132c, 132d, 132e and 132f, the arrangement direction of the selected aperture plate, e.g., 132a or 132d, may be adjusted by the second rotational driving device 142, and thus the utilization efficiency of the aperture plates 132a, 132b, 132c, 132d, 132e and 132f may be improved.

Figure 4:
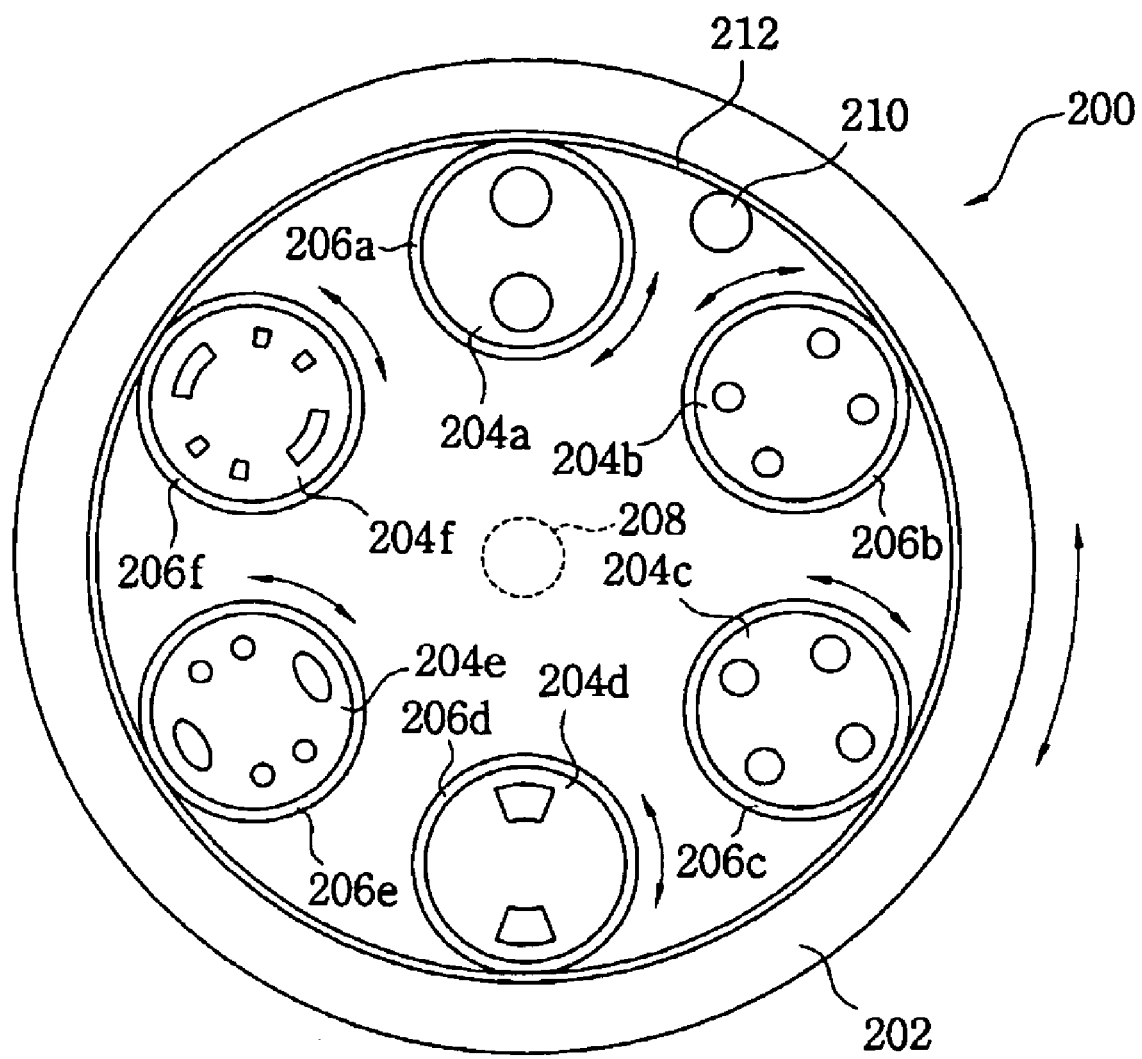
FIG. 4 is a side view illustrating a carrousel optical element holder in accordance with another example embodiment of the present invention.

FIG. 4 is a side view illustrating a carrousel optical element holder in accordance with another example embodiment of the present invention.

Referring to FIG. 4, a carrousel optical element holder 200 may include a support member 202 having a disk shape, a plurality of receiving members 206a, 206b, 206c, 206d, 206e and 206f for receiving a plurality of aperture plates 204a, 204b, 204c, 204d, 204e and 204f, a first rotational driving device 208 for rotating the support member 202, and a second rotational driving device 210 for rotating the aperture plates 204a, 204b, 204c, 204d, 204e and 204f about central axes thereof.

The second rotational driving device 210 may simultaneously rotate the aperture plates 204a, 204b, 204c, 204d, 204e and 204f using a single motor. As shown in FIG. 4, the aperture plates 204a, 204b, 204c, 204d, 204e and 204f may be rotated by rotating a power transmission member 212, for example, an internal gear, engaged with the receiving members 206a, 206b, 206c, 206d, 206e and 206f having external gears. Alternatively, the aperture plates 204a, 204b, 204c, 204d, 204e and 204f may be rotated using a timing belt engaged with the receiving members 206a, 206b, 206c, 206d, 206e and 206f.

As described above, light having different shapes may be formed by multi-pole aperture plates. However, light may be formed by diffraction optical elements, for example, a micro-grating pattern plate. Each diffraction optical element may have a surface on which a micro-grating pattern of a desired pitch and depth may be formed, and may diffract the light beam transmitted through a second fly's eye lens 130 to thereby form light having a desired shape.

Referring again to FIG. 1, a first fly's eye lens 122 may be replaced by a diffraction optical member for forming an annular light so as to improve efficiency of light beam. The annular light formed by the diffraction optical member may be directed into the light forming member, for example, a selected aperture plate or a selected diffraction optical element, through third and fourth lens systems 124 and 128, and a second fly's eye lens 130, and then formed into light having a plurality of poles.

Figure 5:
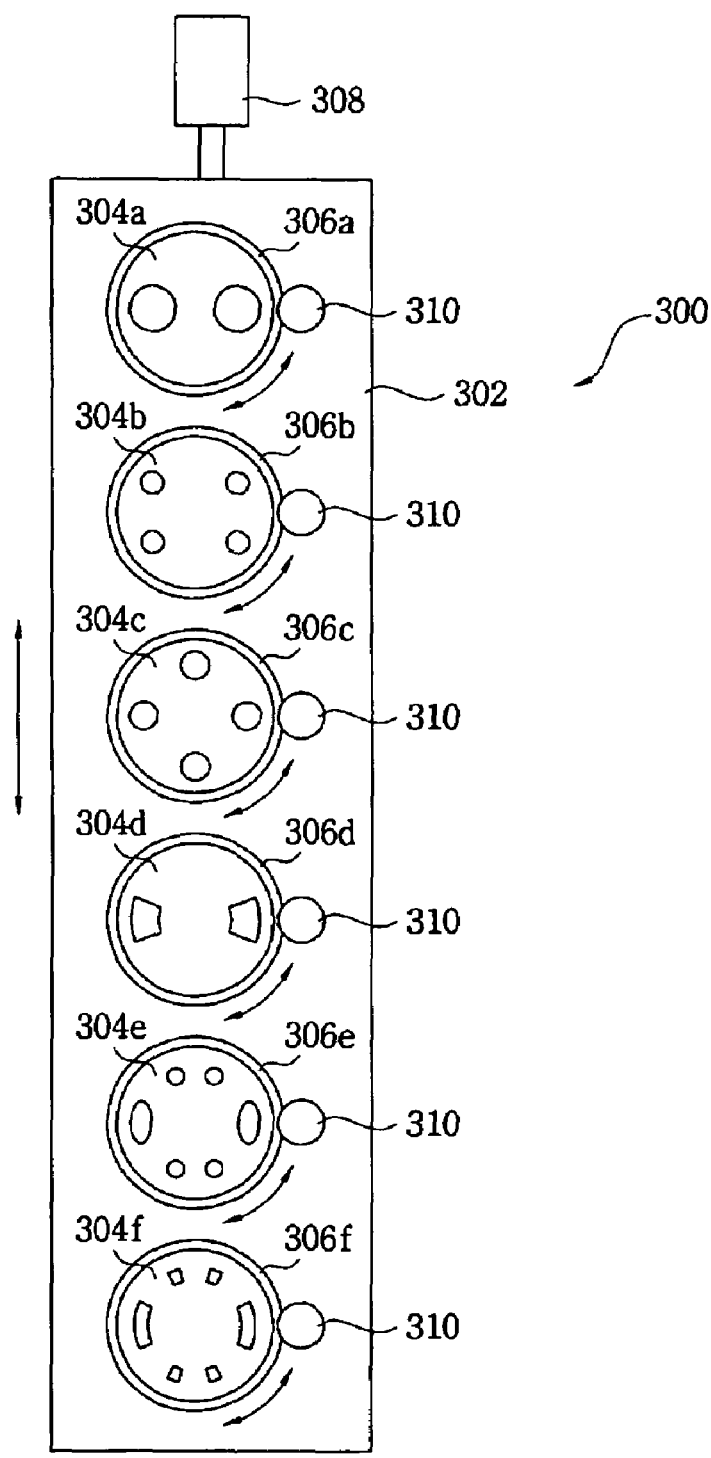
FIG. 5 is a schematic view illustrating an optical element holder in accordance with still another example embodiment of the present invention.

FIG. 5 is a schematic view illustrating an optical element holder in accordance with still another example embodiment of the present invention.

Referring to FIG. 5, an optical element holder 300 may include a support member 302 having a rectangular plate shape extending in either a horizontal or vertical direction, a plurality of receiving members 306a, 306b, 306c, 306d, 306e and 306f for receiving a plurality of aperture plates 304a, 304b, 304c, 304d, 304e and 304f, a first driving device 308 for moving the support member 302 in an extension direction of the support member 302, and a second driving device 310 for rotating the aperture plates 304a, 304b, 304c, 304d, 304e and 304f about their own central axes.

The first driving device 308 may be provided to select one of the aperture plates 304a, 304b, 304c, 304d, 304e and 304f, and the second driving device 310 may be provided to adjust an arrangement direction of the selected aperture plate.

The second driving device 310 may include a plurality of motors to separately rotate the aperture plates 304a, 304b, 304c, 304d, 304e and 304f. Alternatively, the second driving device 310 may simultaneously rotate the aperture plates 304a, 304b, 304c, 304d, 304e and 304f by using a single motor and a power transmission member, for example, an internal gear or a timing belt.

In accordance with example embodiments of the present invention, the optical element corresponding to an image pattern of a reticle may be selected from a plurality of optical elements, for example, aperture plates and diffraction optical elements, by a rotation of a support member, and an arrangement direction of the selected optical element may be adjusted by a rotation of the selected optical element.

Thus, the efficiency of the optical elements may be improved, and a time required for changing optical elements to accommodate various patterns and various types may be reduced.

Consequently, an operating rate of a projection exposure apparatus may be increased, and in addition, the cost required for optical elements may be decreased.

Although example embodiments of the present invention have been described, it is understood that the present invention should not be limited to these example embodiments but various changes and modifications can be made by one skilled in the art within the scope of the example embodiments of the present invention.

What is claimed is:

1. An optical element holder comprising:
a support member configured to support a plurality of optical elements used to form light having different shapes, the plurality of optical elements being arranged circumferentially with respect to a central axis of the support member, wherein the support member has a plurality of holes configured to receive the plurality of optical elements; and
a rotational driving section configured to rotate the support member and the plurality of optical elements, the optical elements configured to rotate about the central axis of the support member, and each of the plurality of optical elements configured to rotate about its central axis.

2. The optical element holder of claim 1, wherein the support member has a disk shape.

3. The optical element holder of claim 1, wherein the support member has a plurality of receiving members rotatably inserted into the plurality of holes and configured to receive the plurality of optical elements.

4. The optical element holder of claim 1, wherein the light include at least two selected from the group consisting of circular light, annular light, dipole light, quadrupole light, cross-pole light, and hexapole light.

5. The optical element holder of claim 1, wherein the rotational driving section includes a first rotational driving section configured to rotate the support member, and a second rotational driving section configured to rotate the plurality of optical elements.

6. The optical element holder of claim 5, wherein the second rotational driving section includes at least one motor to rotate the plurality of optical elements.

7. The optical element holder of claim 5, wherein the second rotational driving section includes a magnet to rotate the plurality of optical elements with magnetic force.

8. A projection exposure apparatus comprising:
a light source configured to generate a light beam;
the optical element holder of claim 1;
a reticle stage configured to support a reticle; and
a projection optical system configured to direct the light transmitted through the reticle to transcribe an image pattern onto a substrate.

9. The projection exposure apparatus of claim 8, wherein the support member has a disk shape.

10. The projection exposure apparatus of claim 8, wherein the support member has a plurality of receiving members rotatably inserted into the plurality of holes and configured to receive the plurality of optical elements.

11. The projection exposure apparatus of claim 8, wherein the plurality of optical elements include at least two selected from the group consisting of a circular aperture plate, a dipole aperture plate, a quadrupole aperture plate, a cross-pole aperture plate, and a hexapole aperture plate.

12. The projection exposure apparatus of claim 8, wherein the light include at least two selected from the group consisting of circular light, annular light, dipole light, quadrupole light, cross-pole light, and hexapole light.

13. The projection exposure apparatus of claim 8, wherein the rotational driving section includes a first rotational driving section configured to rotate the support member and a second rotational driving section configured to rotate the plurality of optical elements.

14. The projection exposure apparatus of claim 13, wherein the second rotational driving section includes at least one motor to rotate the plurality of optical elements.

15. The projection exposure apparatus of claim 13, wherein the second rotational driving section includes a magnet to rotate the plurality of optical elements with magnetic force.

16. An optical element holder comprising:
a support member configured to support a plurality of optical elements used to form light having different shapes, wherein the support member has a plurality of holes configured to receive the plurality of optical elements;
a first driving section configured to move the support member to select one of the plurality of optical elements; and
a second driving section configured to rotate the selected optical element to adjust an arrangement direction of the selected optical element.

17. A projection exposure apparatus comprising:
a light source configured to generate a light beam;
the optical element holder of claim 16;
a reticle stage configured to support a reticle; and
a projection optical system configured to direct the light transmitted through the reticle to transcribe an image pattern onto a substrate.

* * * * *